United States Patent [19]

Pohlmann

[11] 4,454,008

[45] Jun. 12, 1984

[54] ELECTROCHEMICAL METHOD FOR PRODUCING A PASSIVATED JUNCTION IN ALLOY SEMICONDUCTORS

[75] Inventor: Juergen L. W. Pohlmann, Alexandria, Va.

[73] Assignee: The United States of America as represented by the Secretary of the Army, Washington, D.C.

[21] Appl. No.: 469,491

[22] Filed: Feb. 24, 1983

[51] Int. Cl.³ .............................................. C25D 11/32
[52] U.S. Cl. ................................................... 204/15
[58] Field of Search ........................... 204/15, 130, 140

[56] References Cited

U.S. PATENT DOCUMENTS

| | | | |
|---|---|---|---|
| 3,568,305 | 3/1971 | Janning | 204/15 |
| 3,627,647 | 12/1971 | Reuter | 204/15 |
| 3,634,204 | 1/1972 | Ohaka | 204/15 |

Primary Examiner—T. M. Tufariello

Attorney, Agent, or Firm—Robert P. Gibson; Milton W. Lee; Aubrey J. Dunn

[57] ABSTRACT

A ternary or more complex semiconductor alloy is treated to form simultaneously a junction beneath its surface and to passivate the same surface. The treatment consists of connecting the semiconductor to one electrode of an electrolytic circuit, immersing it in an electrolyte which may contain a leachant, and energizing between electrolytic circuit electrodes with a substantially square electric current wave with a direct current average value. After a predetermined time, the semiconductor is removed from the electrolyte, is disconnected from the electrolyte, and is washed, rinsed, and dried. During the process the electric current causes ions of the semiconductor to migrate toward its surface, where they enter the electrolyte. This depletion of ions effectively forms a junction; the current also causes oxidation of the semiconductor surface for passivation.

6 Claims, 2 Drawing Figures

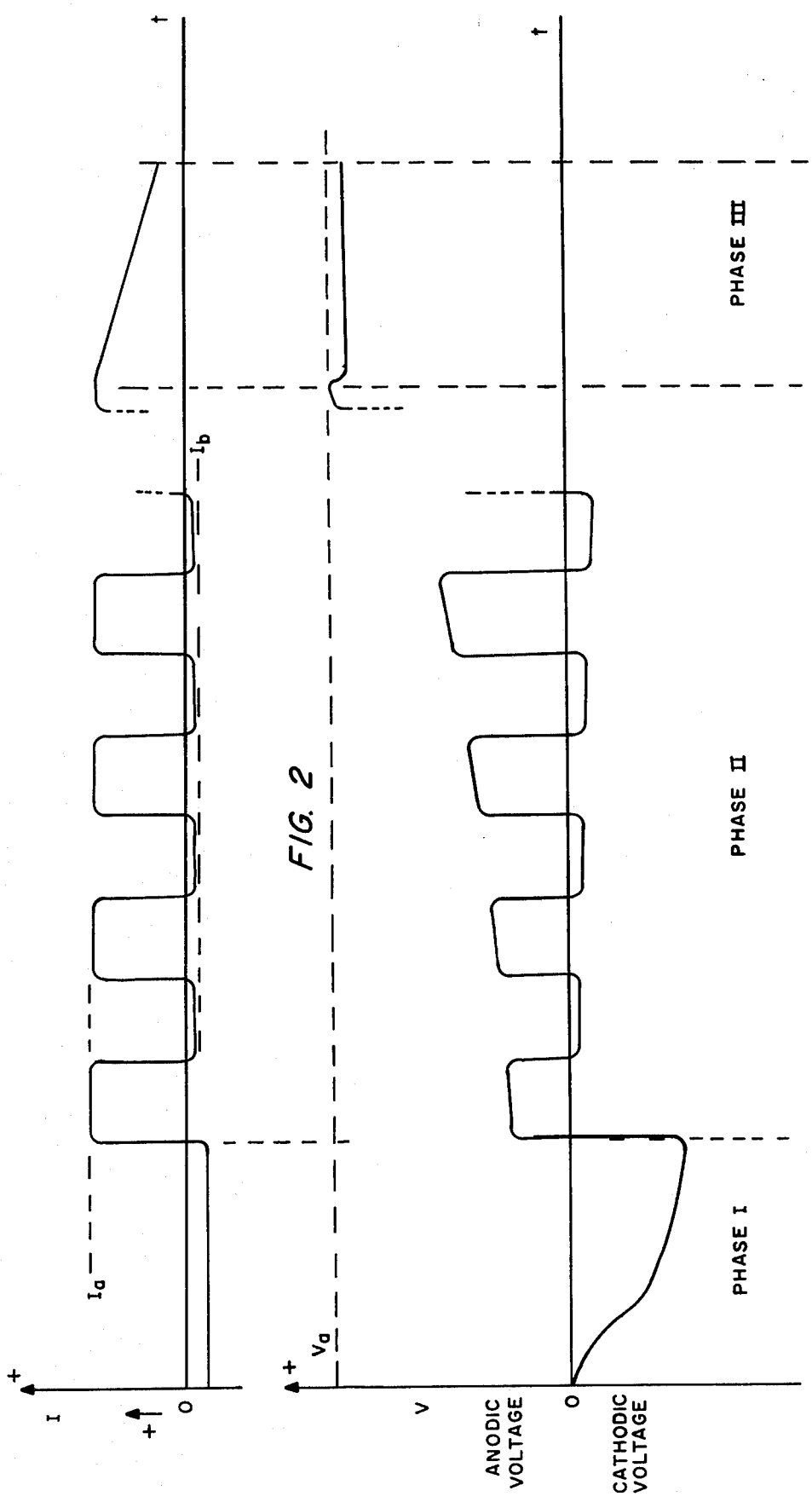

ELECTROCHEMICAL METHOD FOR PRODUCING A PASSIVATED JUNCTION IN ALLOY SEMICONDUCTORS

The invention described herein may be manufactured, used, and licensed by the U.S. Government for governmental purposes without the payment of any royalties thereon.

BACKGROUND OF THE INVENTION

This invention is in the field of semiconductor junction formation. There are several known methods of forming such a junction and these methods all include some way of doping by selectively introducing donor or acceptor impurities into an intrinsic semiconductor material. These methods are usually additive, i.e., they add ions to the semiconductor material. Typical of such methods are diffusion and ion implantation. Diffusion is usually carried out at a temperature well above ambient in order that the diffusing ions will have sufficient thermal energy to migrate into the semiconductor material. Ion implantation is performed in at least a low-grade vacuum, and thermal (or laser) annealing is used subsequently to eliminate surface ion damage of the semiconductor material. After it is formed, by whatever method, the junction, for certain uses, is passivated. This passivation may be done by any one of various known methods, such as vapor depositation or anodizing. What is noteworthly about the various junction forming and passivation methods is that they are performed under drastically different conditions from each other. In other words, no known doping method is compatible with the known passivation methods. By compatible, I mean capable of being performed under the same temperature, atmospheric pressure, and electrical potential conditions. My invention is able to both form a junction in a semiconductor alloy by a subtractive method and to passivate the semiconductor surface under the same conditions. As a matter of fact, both are performed at the same time.

SUMMARY OF THE INVENTION

This invention is a method for simultaneously forming a junction in a ternary (or more complex) semiconductor alloy and passivating the surface thereof. This method is performed by connecting the semiconductor to an electrode in an electrolyte and applying a substantially square current wave thereto. The current induces different rates of migration of the different ions of the semiconductor toward (or away from) the surface of the semiconductor. The electrolyte may contain a leachant to capture and hold those ions which migrate to said surface and to thus effect subtractive doping, or the ions may enter the electrolyte without a leachant being necessary. At the same time that the migrations are occuring, a passivating oxide film is forming on the surface. The invention is thus able to perform, at one set of conditions, operations which previously required two different sets of conditions.

BRIEF DESCRIPTION OF THE DRAWINGS

FIG. 1 shows a voltage waveform (not to scale) of the inventive method.

FIG. 2 shows a current waveform (also not to scale) of said method.

DESCRIPTION OF PREFERRED EMBODIMENT

The invention might be bent understood if this description is taken in conjunction with the drawings. Referring to FIG. 1, we see a voltage v. time plot for the various phases of the invention. The apparatus for performing the inventive method is not shown in the drawings, but is the same apparatus as for the method described in copending U.S. patent application bearing Ser. No. 452,681, filed Dec. 23, 1982 in which I was a joint invention. FIG. 2 of said application shows the apparatus, the instant voltage and current waveforms apply to said FIG. 2. The instant method varies from the previous method in that a ternary or more complex semiconductor alloy substrate (or layer on a substrate) is used, and a leachant may be added to the electrolytic solution. To instant method includes the usual steps of preparing the substrate, mounting or connecting it as or to as electrode, immersing it in an electrolytic solution, and turning on the power.

As can be seen on the drawings, the method includes three phases. Phase I corresponds to the strip phase of the copending invention, phase II corresponds to the anodize phase therein, and phase III corresponds to the anneal step therein. As can be seen, phase I is continued until the voltage curve begins to flatten. Although there is some correspondence between the phases of this invention and the copending invention, and some similarity between voltage and current waveshapes, different processes occur, and different products are produced.

The method of this disclosure begins with a ternary semiconductor alloy substrate (or layer on a substrate) as a workpiece. The workpiece is homogeneous, it essentially flat and, after being connected as an electrode, is coated with an electrolyte masking material, such as a photoresist or wax, on all sides except that side (or sides) which one wishes to dope and anodize. After phase I in which the workpiece serves as a cathode in the electrical circuit, as essentially square current wave is applied in Phase II. This phase continues until the voltage reaches predetermined voltage level $V_a$. Phase III (annealing) then commences, with the DC anodic voltage slightly reduced from $V_a$. This voltage is held until the anodic current drops to about 30% of $I_a$. When this value is reached, the substrate is removed from the electrolyte, the power is deenergized, the substrate is detached from the electrode, and is washed and dried.

Typical materials and conditions of the method are as follows: substrate—a slab of mercury cadmium telluride; Phase I voltage and current —2 volts or less, —100 $\mu A/cm^2$, not to exceed 2 minutes; Phase II modulating period—not less than 2 seconds; $V_a$, $I_a$ and $I_b$—+10 to 20 volts, +250 $\mu A/cm^2$ and —50 $\mu A/cm^2$. In Phase III, the anodic voltage is about one volt less than $V_a$. The electrolyte is a 10% aqueous solution as described in the above-referenced copending application, but a complexing agent may be added as a leachant. During electrolysis the mercury ions migrate to the surface of the slab, and dissolve into the electrolyte or are captured by the leachant. The oxide layer formed is primarily $TeO_2$, although it will contain other oxides.

Although a specific set of materials and conditions is given above, general procedures may guide one in practicing this method. First, the semiconductor material must be one capable of being anodized, i.e., at least one element of the material must form a surface oxide layer nonsoluble in the electrolyte. Further, the material, whether ternary or more complex, must have two cations which migrate at different rates in response to an applied voltage. The component capable of forming the oxide layer is an anion. In the case of four element (or greater) compounds, the anion may involve more than one element. Obviously, the formed oxide layer must allow migration of the ions through the oxide layer. Other typical ternary materials usable in the method are alloys shown hereafter, using a shorthand symbology wherein parentheses designate the cations of the compound and the comma within the parentheses indicates variable ratios of the elements therein. These alloys are HgGaAs, (Hg,Cd)Se, (Pb, Sn)Te, (Hg, Mn)Te, (HgZn)Te, (Ga, In)P, (Ga,Al)P, and (Ga, In)As. Typical four element compounds are: (Hg, Cd)(Te, Se), (Pb, Sn)(Te, Se), and (Ga, In)(As, P), with cations in one parentheses and anions in the other parentheses, wherein the ratios of the elements in the parentheses may vary.

I claim:

1. A method of electrochemically producing, in the electrolyte of a electrolytic circuit having two electrodes, on at least one surface of at least a ternary semiconductor alloy layer with two of its components being cations and the other an anion, a passivated junction, including the steps of:

(a) connect the layer to one electrode of the electrolytic circuit;

(b) energize between the one electrode and the other electrode with an essentially square wave of current and an increasing square-wave modulated voltage, both said current and said voltage having cathodic phases of less amplitudes than their anodic phases, whereby the two cations of the layer migrate at different rates toward the one surface of the layer in response to the voltage, whereby one cation passes into the electrolyte at a greater rate than the other one, and whereby said anion forms an oxide on said one surface;

(c) remove the layer from the electrolyte;

(d) deenergize the electrodes;

(e) disconnect the layer from the one electrode; and wash, rinse, and dry the layer.

2. The method as set forth in claim 1 further including the steps of:

(a') energize the layer with a cathodic voltage between steps (a) and (b), and;

(b') energize the layer with a anodic voltage between steps (b) and (c).

3. The product as produced by claim 1.

4. The product as produced by claim 2.

5. The method as set forth in claim 1 wherein the electrolyte contains a complexing agent.

6. The method as set forth in claim 2 wherein the electrolyte contains a complexing agent.

* * * * *